(12) United States Patent
Chan et al.

(10) Patent No.: US 12,012,652 B2
(45) Date of Patent: Jun. 18, 2024

(54) SINGLE PROCESS VOLUME TO PERFORM HIGH-PRESSURE AND LOW-PRESSURE PROCESSES WITH FEATURES TO REDUCE CROSS-CONTAMINATION

(71) Applicant: Applied Materials, Inc., Santa Clara, CA (US)

(72) Inventors: Kelvin Chan, San Ramon, CA (US); Yang Guo, Fremont, CA (US); Ashish Goel, Sunnyvale, CA (US); Anantha Subramani, San Jose, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 80 days.

(21) Appl. No.: 16/395,015

(22) Filed: Apr. 25, 2019

(65) Prior Publication Data
US 2019/0352774 A1   Nov. 21, 2019

Related U.S. Application Data

(60) Provisional application No. 62/674,318, filed on May 21, 2018.

(51) Int. Cl.
*H01J 37/32* (2006.01)
*C23C 14/34* (2006.01)
(Continued)

(52) U.S. Cl.
CPC .......... *C23C 16/4402* (2013.01); *C23C 14/34* (2013.01); *C23C 16/402* (2013.01);
(Continued)

(58) Field of Classification Search
CPC ..... C23C 14/34; C23C 14/564; C23C 16/402; C23C 16/405; C23C 16/4402;
(Continued)

(56) References Cited

U.S. PATENT DOCUMENTS 5,183,547 A  *  2/1993  Ikeda ................... C23C 14/56
                                                    204/298.25
5,244,554 A  *  9/1993  Yamagata ............. C23C 14/568
                                                     156/345.33

(Continued)

FOREIGN PATENT DOCUMENTS

CN     102308362 A1    1/2012
WO     WO0209147 A2    1/2002

OTHER PUBLICATIONS

International Search Report and Written Opinion from PCT/US2019/029460 dated Aug. 5, 2019, 12 pgs.

(Continued)

*Primary Examiner* — Rodney G McDonald
(74) *Attorney, Agent, or Firm* — Schwabe, Williamson & Wyatt, P.C.

(57) ABSTRACT

Embodiments include a processing tool for processing substrates in a low processing pressure and a high processing pressure. In an embodiment, the processing tool comprises a chamber body and a pedestal in the chamber body. In an embodiment, the pedestal is displaceable, and the pedestal has a first surface and a second surface opposite the first surface. In an embodiment, the processing tool further comprises a first gas port for supplying gasses into the chamber body and a first exhaust positioned above the first surface of the pedestal. In an embodiment, the embodiment further comprises a second gas port for supplying gasses into the chamber body and a second exhaust positioned below the second surface of the pedestal.

11 Claims, 7 Drawing Sheets

(51) Int. Cl.
*C23C 16/40* (2006.01)
*C23C 16/44* (2006.01)
*C23C 28/04* (2006.01)
*H01L 21/02* (2006.01)
*H01L 21/285* (2006.01)

(52) U.S. Cl.
CPC ........ *C23C 16/405* (2013.01); *C23C 16/4409* (2013.01); *C23C 28/042* (2013.01); *H01J 37/3244* (2013.01); *H01J 37/32715* (2013.01); *H01J 37/32871* (2013.01); *H01L 21/02164* (2013.01); *H01L 21/02271* (2013.01); *H01L 21/28568* (2013.01); *H01J 2237/20235* (2013.01); *H01J 2237/3321* (2013.01); *H01L 21/02274* (2013.01); *H01L 21/0228* (2013.01)

(58) Field of Classification Search
CPC ... C23C 16/4409; C23C 16/54; C23C 28/042; H01J 37/3244; H01J 37/32715; H01J 37/32871; H01J 2237/20235; H01J 2237/3321; H01L 21/02164; H01L 21/02271; H01L 21/28568; H01L 21/67017; H01L 21/6719; H01L 21/68742; H01L 21/68757; H01L 21/68764; H01L 21/02274; H01L 21/0228
USPC .......................... 204/298.25, 298.18, 298.07
See application file for complete search history.

(56) References Cited

U.S. PATENT DOCUMENTS

| | | | | |
|---|---|---|---|---|
| 5,322,605 | A | * | 6/1994 | Yamanishi .......... H01J 37/3405 |
| | | | | 204/298.07 |
| 6,899,795 | B1 | * | 5/2005 | Dubs .................... C23C 14/225 |
| | | | | 204/192.12 |
| 7,700,898 | B2 | * | 4/2010 | Seo .................. H01L 21/67757 |
| | | | | 219/390 |
| 8,097,133 | B2 | * | 1/2012 | Inagawa .......... H01J 37/32449 |
| | | | | 204/298.22 |
| 2003/0000936 | A1 | | 1/2003 | Kim et al. |
| 2005/0016843 | A1 | | 1/2005 | Dubs et al. |
| 2005/0268856 | A1 | | 12/2005 | Miller et al. |
| 2006/0130761 | A1 | | 6/2006 | Sakai |
| 2010/0202860 | A1 | | 8/2010 | Reed et al. |
| 2010/0288625 | A1 | * | 11/2010 | Nakamura .......... C23C 14/0063 |
| | | | | 204/192.1 |
| 2013/0102155 | A1 | * | 4/2013 | Gang .................... H01J 37/321 |
| | | | | 438/710 |
| 2017/0229317 | A1 | | 8/2017 | Shen et al. |

OTHER PUBLICATIONS

International Preliminary Report on Patentability from PCT/US2019/029460 dated Dec. 3, 2020, 8 pgs.
Official Letter from Taiwan Patent Application No. 108115997 dated Dec. 1, 2022, 14 pgs.

* cited by examiner

SINGLE PROCESS VOLUME TO PERFORM HIGH-PRESSURE AND LOW-PRESSURE PROCESSES WITH FEATURES TO REDUCE CROSS-CONTAMINATION

CROSS-REFERENCE TO RELATED APPLICATIONS

This application claims the benefit of U.S. Provisional Application No. 62/674,318, filed on May 21, 2018, the entire contents of which are hereby incorporated by reference herein.

BACKGROUND

1) Field

Embodiments relate to the field of semiconductor processing equipment and, in a particular embodiment, to a processing tool for implementing both low-pressure and high-pressure processing operations.

2) Description of Related Art

Currently available processing tools are designed to accommodate a single range of processing pressures. High-pressure processing operations (e.g., chemical vapor deposition (CVD), plasma enhanced CVD (PECVD), metal-organic CVD (MOCVD), thermal CVD, atomic layer deposition (ALD), or plasma enhanced ALD (PEALD)) and low-pressure processing operations (e.g., physical vapor deposition (PVD)) need to be implemented in different processing chambers in order to avoid the risk of cross-contamination.

Accordingly, a substrate with a multi-layer film with different material layers needs to be moved back and forth between processing chambers after each layer is formed. The movement between different processing chambers takes time and decreases the throughput. Additionally, two processing chambers requires more real estate dedicated to the process in the fabrication facility.

SUMMARY

Embodiments include a processing tool for processing substrates in a low processing pressure and a high processing pressure. In an embodiment, the processing tool comprises a chamber body and a pedestal in the chamber body. In an embodiment, the pedestal is displaceable, and the pedestal has a first surface and a second surface opposite the first surface. In an embodiment, the processing tool further comprises a first gas port for supplying gasses into the chamber body and a first exhaust positioned above the first surface of the pedestal. The embodiment further comprises a second gas port for supplying gasses into the chamber body and a second exhaust positioned below the second surface of the pedestal.

Embodiments may also include a method of processing a substrate. In an embodiment, the method may comprise placing a substrate on the pedestal, displacing the pedestal to the high-pressure sub-volume of the processing chamber, and processing the substrate with a high-pressure processing operation to form a first film on the substrate. In an embodiment, the method may further comprise displacing the pedestal to the low-pressure sub-volume of the processing chamber, and processing the substrate with a low-pressure processing operation to form a second film on the substrate.

Embodiments may also include a processing tool that comprises a chamber body, a high-pressure sub-volume in the chamber body, a low-pressure sub-volume in the chamber body, and a displaceable pedestal for supporting a substrate in the chamber body.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices in accordance with embodiments described herein include processing tools for implementing high-pressure and low-pressure processing operations, and methods for using such processing tools. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, a single processing volume is currently not able to accommodate both a high-pressure process and a low-pressure process. Accordingly, embodiments described herein include a processing tool that allows for both high-pressure processing operations and low-pressure processing operations to be implemented in a single chamber. In an embodiment, the processing tool comprises a chamber body that comprises a high-pressure sub-volume and a low-pressure sub-volume. A displaceable pedestal may move a substrate between the two sub-volumes in order to implement the desired high or low-pressure process. Furthermore, embodiments may also include cross-contamination reduction features that limit the cross-contamination between the two sub-volumes.

Embodiments include processing methods for using a processing tool with two sub-volumes that operate at different pressures. Accordingly, a multi-layer film with alternating layers may be formed in a single chamber. In particular embodiments, a first layer may be formed with a high-pressure process and a second layer may be formed with a low-pressure process. Additional first layers and second layers may be deposited to form a material stack that comprises a plurality of layers formed with a high-pressure process in an alternating pattern with a plurality of layers formed with a low-pressure process. Such multi-layer stacks are useful for several different classes of devices. For example, alternating layers of a conductive material and an insulator may be used to fabricated three-dimensional memory devices (e.g., 3D NAND devices). Additionally, optical devices (e.g., mirrors, resonators, etc.) may be fabricated by using alternating layers of a high refractive index material and a low refractive index material. With respect to optical devices, processing chambers such as those described herein allow for low surface roughness and the ability to tune the stress within the film by using dual frequency processes. Accordingly, the quality of optical devices is improved over existing structures.

Such embodiments are particularly beneficial over the current state of the art described above because they improve the throughput of forming such multi-layer films. The throughput is increased since a single chamber is used to form the multi-layer film, compared to the need to move a substrate between chambers. Additionally, the use of a single chamber saves valuable real estate in the facility. Furthermore, a single chamber allows for in situ pre- and/or post-processing without a vacuum break.

Figure 1A:
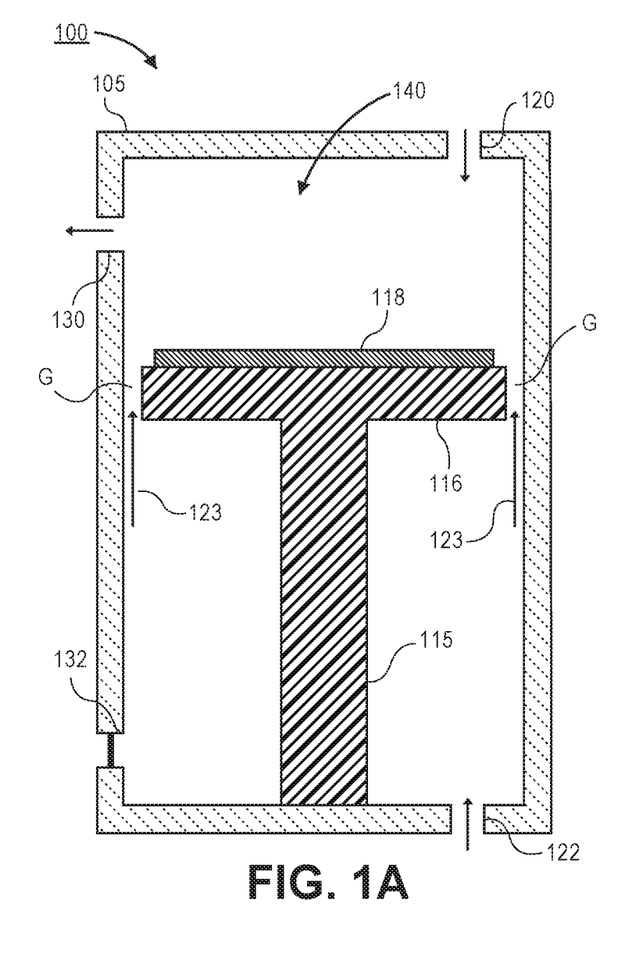
FIG. 1A is a cross-sectional illustration of a processing tool for implementing high-pressure and low-pressure processes, where the tool is set up for a high-pressure processing operation, in accordance with an embodiment.
Figure 1B:
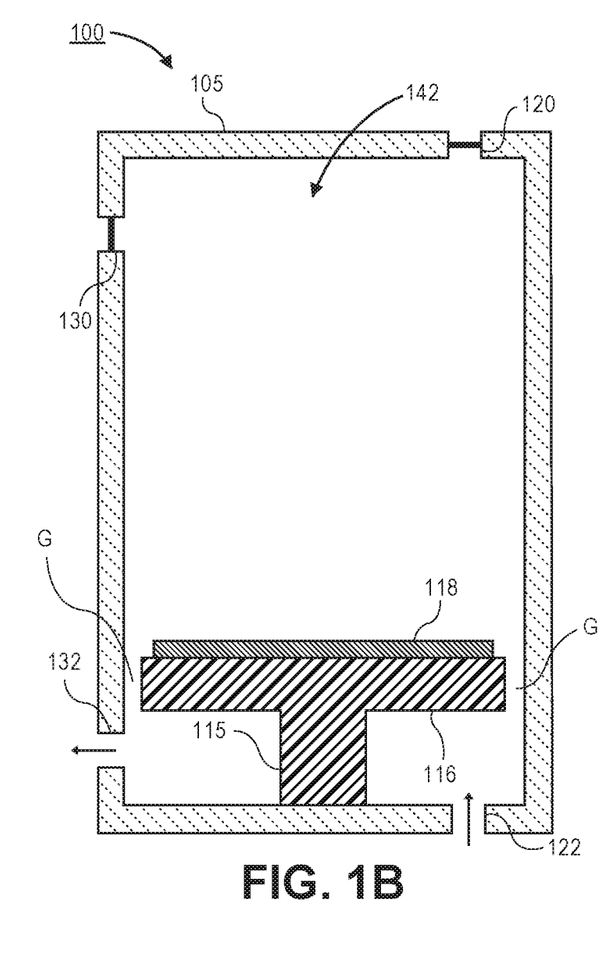
FIG. 1B is a cross-sectional illustration of a processing tool for implementing high-pressure and low-pressure processes, where the tool is set up for a low-pressure processing operation, in accordance with an embodiment.

Referring now to FIGS. 1A and 1B a pair of cross-sectional illustrations of a processing tool 100 with the capability of implementing high-pressure and low-pressure processing operations is shown, in accordance with an embodiment. In an embodiment, the processing tool 100 comprises a chamber body 105. The chamber body 105 may be any suitable chamber body capable of implementing high-pressure and low-pressure processing operations. As used herein, "low-pressure" may refer to approximately 1 Torr or below, and "high-pressure" may 1 Torr or above. In an embodiment, "low pressure" may refer to approximately 0.005 Torr or less, and "high-pressure" may refer to 5 Torr or more. In an embodiment, high-pressure processing operations may include processes such as, but not limited to, chemical vapor deposition (CVD), plasma enhanced CVD (PECVD), metal-organic CVD (MOCVD), thermal CVD, or atomic layer deposition (ALD). In an embodiment, low-pressure may include processes such as, but not limited to physical vapor deposition (PVD).

In an embodiment, the processing tool 100 may comprise a displaceable pedestal 116. In an embodiment, the pedestal 116 may support one or more substrates 118 that are being processed in the processing tool 100. In an embodiment, the pedestal 116 may be displaceable between a high-pressure sub-volume 140 (FIG. 1A) and a low-pressure sub-volume 142 (FIG. 1B). For example, the pedestal 116 may be displaced by a mechanical support 115. In the embodiments illustrated in FIGS. 1A and 1B, the mechanical support 115 is shown as supporting the pedestal 116 from below, though other configurations for supporting and displacing the pedestal 116 may also be used. In an embodiment, the pedestal 116 is displaced in a substantially vertical direction. However, it is to be appreciated that the pedestal 116 may also be displaced in non-vertical directions. For example, as will be described in greater detail below with respect to FIG. 3, the pedestal 116 may be displaced in a substantially lateral direction.

In an embodiment, a first gas port 120 and a first exhaust 130 may be used during a high-pressure processing operation. The first gas port 120 may supply first processing gasses into the high-pressure sub-volume 140 and the first exhaust 120 may be used to remove byproducts and maintain a desired pressure during high-pressure processing operations. While a single first gas port 120 is shown, it is to be appreciated that any number of first gas ports 120 may be used. In an embodiment, first processing gasses may be flown into the high-pressure sub-volume 140 by a gas distribution plate or the like. In order to prevent cross-contamination between the high-pressure sub-volume 140 and the portion of the low-pressure sub-volume below the pedestal 116, surfaces of the pedestal 116 may be spaced away from an interior surface of the chamber body 105 by a gap G. In an embodiment, the gap G may be minimized in order to reduce cross-contamination between the high-pressure sub-volume and the low-pressure sub-volume. In an embodiment, during high-pressure processing operations implemented in the high-pressure sub-volume 140, there may not be a vacuum seal between the high-pressure sub-volume 140 and the portion of the low-pressure sub-volume 142 below the pedestal 116. Accordingly, reducing the cross-section of the gap G minimizes cross-contamination. In an embodiment, the gap G may be less than 15 mm, less than 10 mm, less than 5 mm, or less than 1 mm.

In an embodiment, cross-contamination may be further reduced by supplying a counter gas 123 to the gap G, as indicated by the arrows. In an embodiment, the counter gas 123 may be supplied by a second gas port 122 located below the pedestal 116. Since a second exhaust 132 (used for low-pressure processing operations) is closed during the high-pressure processing operations, the counter gas 123 flows up through the gap G and reduces cross-contamination. It has been found that the use of a counter gas 123 may result in the generation of a parasitic plasma below the pedestal during the high-pressure process. Accordingly, embodiments may include a counter gas 123 or gas mixture 123 that minimizes the formation of a parasitic plasma. For example, the counter gas 123 may comprise one or both of nitrogen gas and helium gas.

Referring now to FIG. 1B, the pedestal 116 has been displaced so that the substrate 118 may be processed with a low-pressure processing operation. In an embodiment, the low-pressure processing operation may be implemented in low-pressure processing sub-volume 142. In some embodiments, such as the embodiment illustrated in FIG. 1B, the low-pressure processing volume 142 may also comprise portions of the high-pressure processing volume 140. Accordingly, some portions of the high-pressure processing volume 140 may be exposed during the low-pressure processing operation. In order to minimize outgassing of byproducts from the high-pressure processing operation, sidewalls of the chamber body 105 may be heated. For example, the sidewalls of the chamber body 105 may be maintained at a temperature between 50° C. and 400° C. In some embodiments, a shutter (not shown) may also be used to separate the low-pressure sub-volume 142 from the high-pressure sub-volume 140 in order to reduce cross-contamination.

In an embodiment, the first gas port 120 and the first exhaust 130 may be closed and the second exhaust 142 and the second gas port 122 may be open during the low-pressure processing operation. While a single second gas port 122 is shown, it is to be appreciated that any number of second gas ports 122 may be used. In an embodiment, second processing gasses may be flown into the low-pressure sub-volume 142 by a gas distribution plate or the like.

It is to be appreciated that the processing tool 100 illustrated in FIGS. 1A and 1B is simplified in order to not obscure embodiments described herein. In an embodiment, processing tool 100 may further comprise components typical of processing tools used for high-pressure and low pressure processing operations. For example, the processing tool 100 may further comprise heating and/or cooling elements in the pedestal 116 to control a temperature of the substrate. In an embodiment, the pedestal 116 may be an electrostatic chuck for holding the substrate 118. In an embodiment, the processing tool 100 may comprises plasma sources, such as a capacitively coupled plasma (CCP) source, an inductively coupled plasma (ICP) source, a remote plasma source (RPS), a microwave plasma source, or the like. In an embodiment, the processing tool 100 may further comprise a target, such as a metallic target for use with low-pressure processes, such as sputtering or the like. While several additional components of processing tool 100 are explicitly disclosed herein, it is to be appreciated that embodiments may comprise any number of additional processing tool components.

Figure 2:
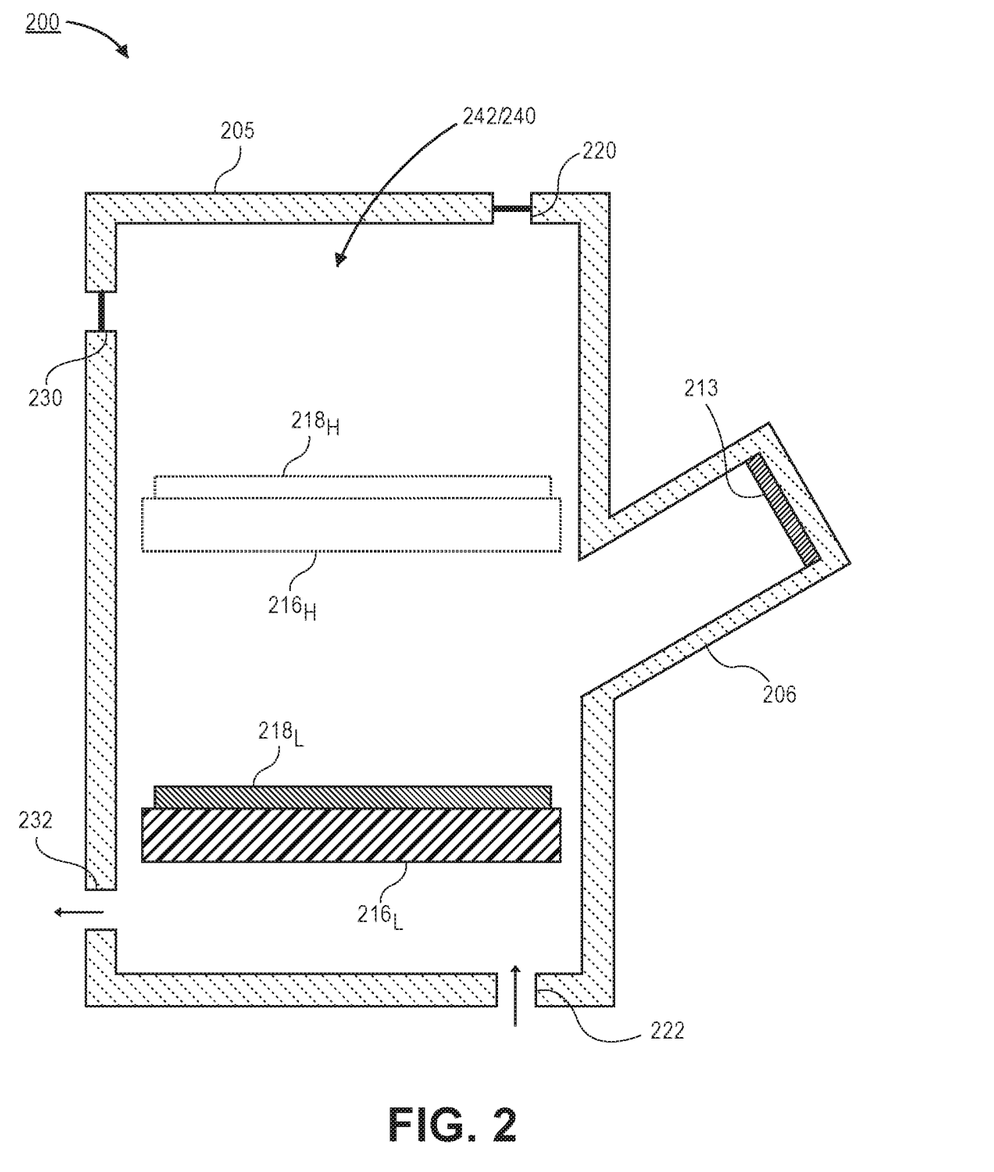
FIG. 2 is a cross-sectional illustration of a processing tool for implementing high-pressure and low-pressure processes, where the low-pressure process includes an off-axis chamber portion, in accordance with an embodiment.

Referring now to FIG. 2, a cross-sectional illustration of a processing tool 200 that is utilized for low-pressure and high-pressure processing operations is shown, in accordance with an embodiment. In an embodiment, processing tool 200 may be substantially similar to the processing tool 100 described above, with the exception that the processing tool further comprises an off-axis chamber portion 206. In an embodiment, the off-axis chamber portions 206 may be fluidically coupled to the low-pressure sub-volume 242 of the processing tool 200.

In an embodiment, the off-axis chamber portion 206 may be utilized when the pedestal 216L is in a low-pressure position. When the pedestal 216H is in position for a high-pressure processing operation (illustrated with dashed lines), the pedestal 216 may be above the interface between the off-axis chamber portion 206 and the low-pressure sub-volume 242. Accordingly, the high-pressure processing operation may be implemented in the high-pressure sub-volume 240 that does not include the off-axis chamber portion 206. In an embodiment, the off-axis chamber portion 206 may comprise components for implementing the low-pressure process. For example, the off-axis chamber portion 206 may comprise a target 213 (e.g., for a sputtering process or the like).

Figure 3:
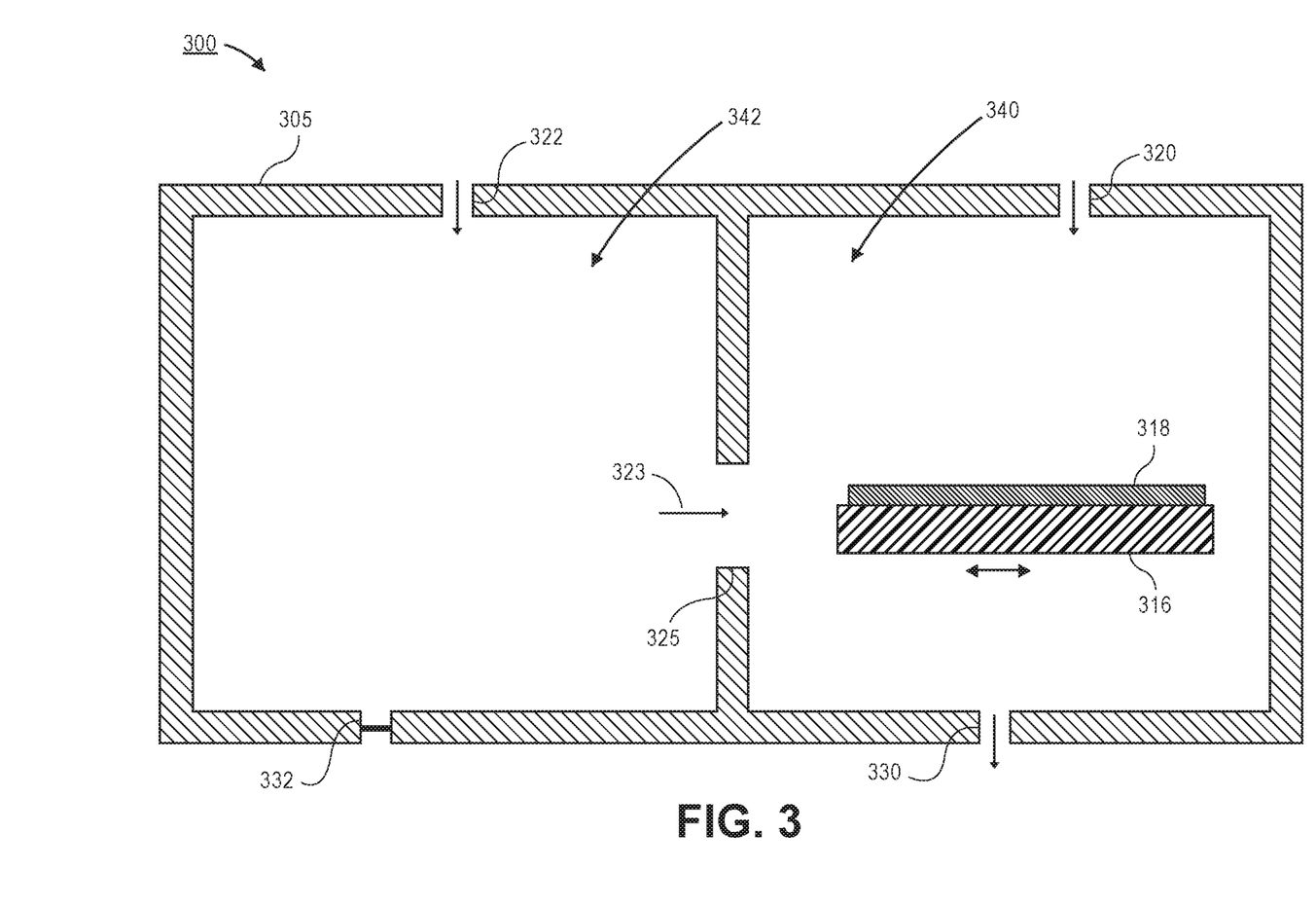
FIG. 3 is a cross-sectional illustration of a processing tool for implementing high-pressure and low-pressure processes that has a lateral configuration, in accordance with an embodiment.

Referring now to FIG. 3, a cross-sectional illustration of a processing tool 300 for implementing both high-pressure and low-pressure processing operations is shown, in accordance with an embodiment. In an embodiment, the processing tool 300 may be referred to as having a substantially lateral layout. In a particular embodiment, the chamber body 305 may be separated into a low-pressure sub-volume 342 and a high-pressure sub-volume 340 that are substantially distinct from one another. In an embodiment, the pedestal 316 may move a substrate 318 laterally between the two sub-volumes 340/342 through a port 325.

Similar to the use of a gap G with a minimal cross-section, the port 325 may have a minimal cross-section in order to prevent cross-contamination between the high-pressure processing volume 340 and the low-pressure processing volume 342. In an embodiment, a counter gas 323 may also be applied to the port 325 when the processing tool 300 is implementing a high-pressure processing operation, as shown in FIG. 3. In an embodiment, a shutter (not shown) may also be used to close the port 325 to further reduce cross-contamination.

Figure 4A:
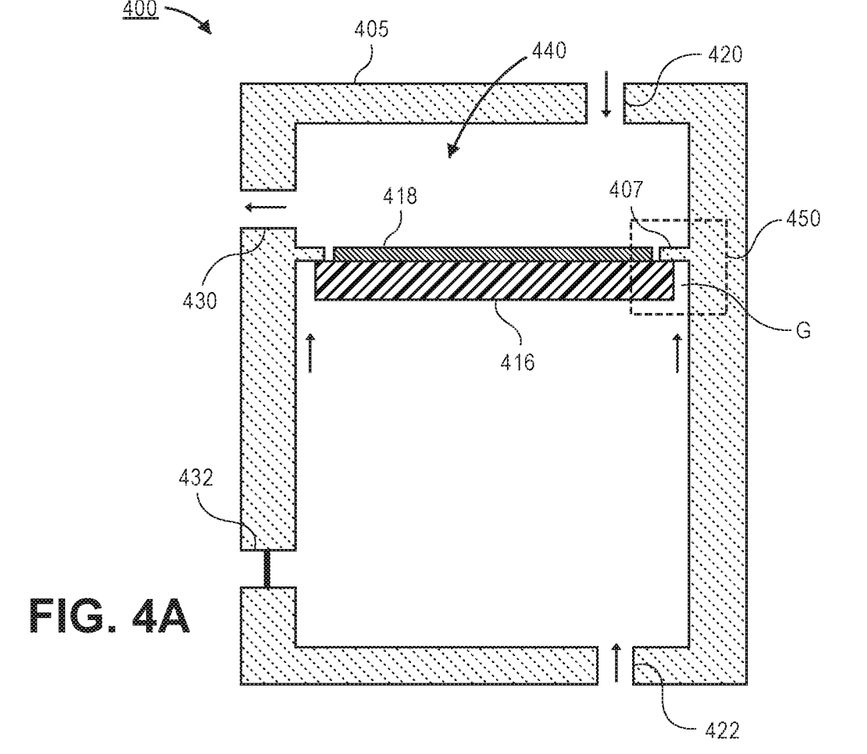
FIG. 4A is a cross-sectional illustration of a processing tool for implementing high-pressure and low-pressure processes that has a contamination reduction component, in accordance with an embodiment.

Referring now to FIG. 4A, a cross-section of a processing tool 400 that includes a cross-contamination reduction feature 407 is shown, in accordance with an embodiment. In an embodiment, the cross-contamination reduction feature 407 may comprise a circumferential seal that interfaces with the pedestal 416. In such an embodiment, the seal 407 may contact the pedestal 416 in order to substantially seal the gap G. In an embodiment, a counter gas 423 may also be applied in order to further mitigate cross-contamination since the seal may not be perfect.

Figure 4B:
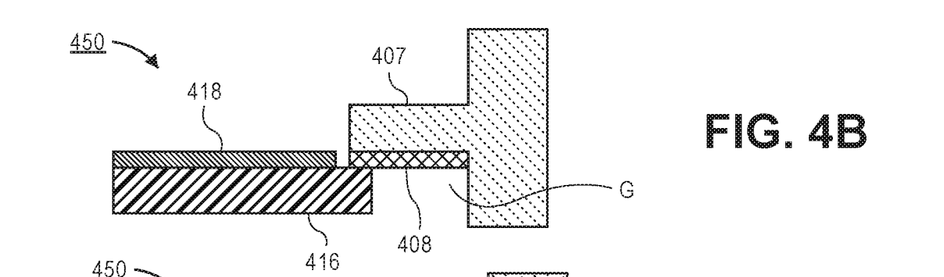
FIG. 4B is a cross-sectional illustration that more clearly illustrates the contamination reduction component, in accordance with an embodiment.
Figure 4C:
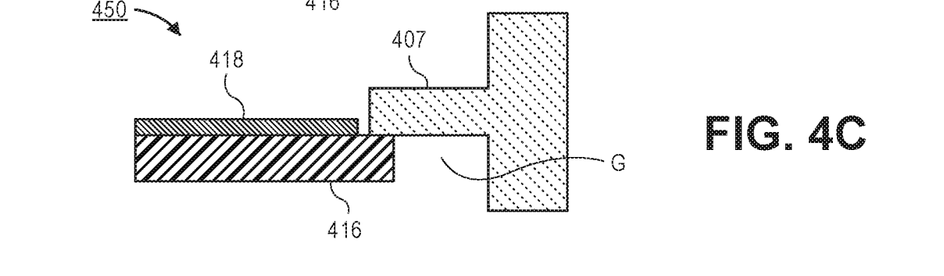
FIG. 4C is a cross-sectional illustration of the contamination reduction component, in accordance with an additional embodiment.

Referring now to FIG. 4B, a zoomed in illustration of region 450 in FIG. 4A is shown, in accordance with an embodiment. In an embodiment, the seal 407 may be separated from the pedestal 416 by a gasket material 408 in order to improve the seal. In an embodiment, the gasket material 408 may be an elastomeric material, as is known in the art. Referring now to FIG. 4C, a zoomed in illustration of region 450 in FIG. 4A is shown, in accordance with an additional embodiment. In FIG. 4C, the seal 407 is in direct contact with the pedestal 416.

Figure 5:
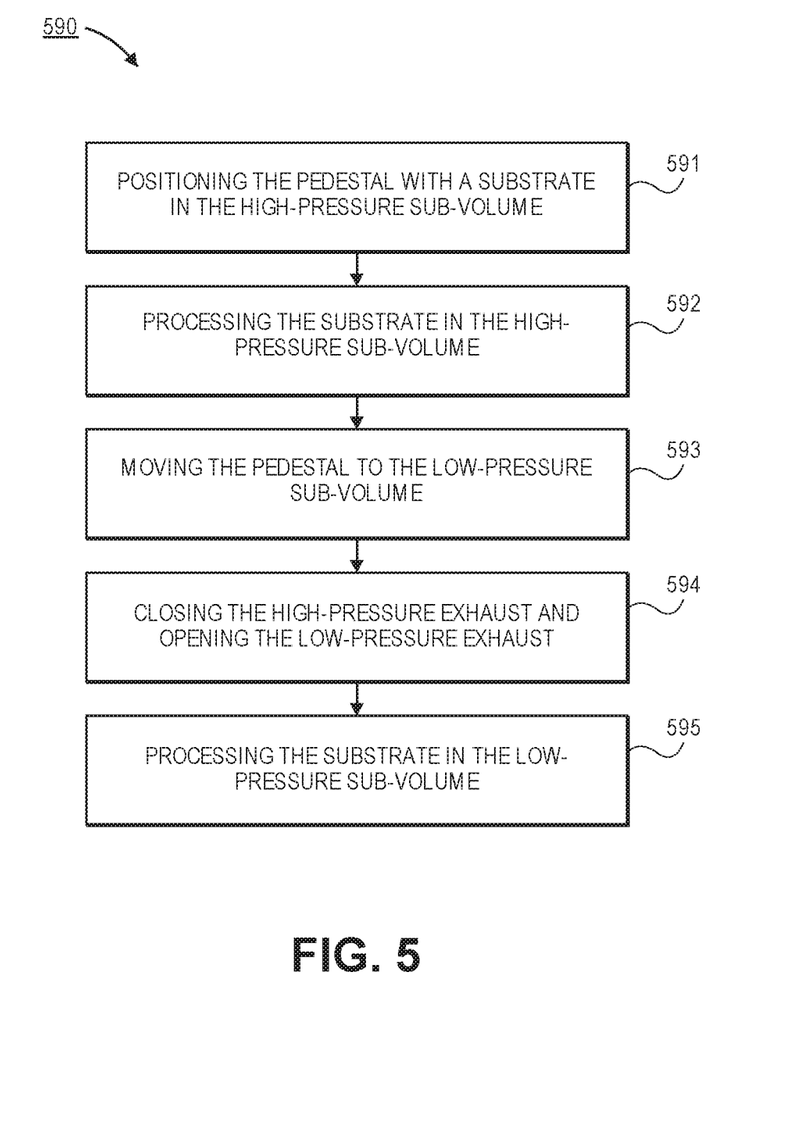
FIG. 5 is a flow diagram of a process for implementing a high-pressure processing operation and a low-pressure processing operation in a single processing tool, in accordance with an embodiment.

Referring now to FIG. 5 a process flow diagram of a method 590 for processing a substrate is shown, in accordance with an embodiment. The processing operations described with respect to method 590 are described in conjunction with processing tool 100 described in FIGS. 1A and 1B. However, it is to be appreciated that substantially similar processes may be implemented in conjunction with any processing tool described in accordance with embodiments described herein.

In an embodiment, one or more process preparation operations may be implemented prior to implementing method 590. For example, a substrate 118 may be placed on the pedestal 116 while the pedestal 116 is positioned in the low-pressure sub-volume 142 of the processing tool 100. Thereafter, the processing tool 100 may be pumped down with the low-pressure exhaust 132 while the high-pressure exhaust 130 is closed. For example, the low pressure exhaust 132 may pump down the processing tool 100 to a pressure below the pressure used for the low-pressure processing operation. For example, the processing tool 100 may be pumped down to approximately 1E-5 Torr or less. In an embodiment, the processing tool 100 may be purged. For example, 1 or more cycles of an inert purge between 1E-3 Torr and 1E-5 Torr may be used to purge the processing tool 100 as is known in the art. After the purging, embodiments may include closing the low-pressure exhaust 132 and opening the high-pressure exhaust 130. In an embodiment where a counter gas 123 is used, the counter gas 123 may be flown into the chamber through the second gas port 122. In an embodiment, the counter gas 123 may be an inert gas. In a particular embodiment, the counter gas 123 may be chosen from a group of gasses that limit the generation of a parasitic plasma. For example, the counter gas 123 may comprise one or both of nitrogen gas and helium gas.

Referring now to operation 591, method 590 may comprise positioning the pedestal 116 with a substrate 118 in the high-pressure sub-volume 140 of a processing tool 100. For example, the pedestal 116 may be positioned similar to what the positioning of the pedestal 116 illustrated in FIG. 1A. In embodiments where a cross-contamination reduction feature (e.g., a seal 407 similar to what is illustrated in FIG. 4A), operation 591 may comprise bringing the pedestal 116 into contact with (or in close proximity to) the cross-contamination reduction feature.

Referring now to operation 592, method 590 may comprise processing the substrate 118 in the high-pressure processing volume 140. In an embodiment, operation 592 may comprise opening the first gas port 120 to allow first processing gasses to flow into the high-pressure processing volume 140. In embodiments where a plasma is used, operation 592 may also comprise striking a plasma. In an embodiment, the high-pressure processing operation may comprise depositing a first film on the surface of the substrate 118. After the first film is formed to a desired thickness, the first gas port 420 may be closed.

Referring now to operation 593, method 590 may comprise moving the pedestal to the low-pressure sub-volume 142. In an embodiment, the pedestal may be moved to a position substantially similar to the positioned illustrated in FIG. 1B. In embodiments where an off-axis chamber portion (e.g., the off-axis chamber portion 206 illustrated in FIG. 2), moving the pedestal to the low-pressure sub-volume 142 may comprise moving the pedestal to a position below the opening to the off-axis chamber portion. In an embodiment, the counter gas 123 may be maintained on while the pedestal 116 is being displaced to the low-pressure sub-volume 142.

Referring now to operation 594, method 590 may comprise closing the high-pressure exhaust 130 and opening the low-pressure exhaust 132. In an embodiment, the low-pressure exhaust 132 may pump the low-pressure sub-volume 142 to a pressure below the process pressure of the low-pressure operation and purge the processing tool 100. For example, the low-pressure exhaust 132 may pump down the processing tool 100 to approximately 1E-5 or less, and may purge the processing tool with one or more cycles of an inert gas between approximately 1E-3 Torr and 1E-5 Torr.

Referring now to operation 595, method 500 may comprise processing the substrate 118 in the low-pressure sub-volume 595. In an embodiment, processing the substrate 118 in the low-pressure sub-volume 595 may comprise flowing second processing gasses into the low-pressure sub-volume 142 through the second gas port 122. In embodiments where a plasma is used for the low-pressure process, a plasma may be struck. In an embodiment, the low-pressure process may comprise depositing a second film over the first film. In an embodiment, the second film is a different material than the first film. After the second film is deposited to the desired thickness, the flow of the second processing gasses may be stopped.

In an embodiment, method 500 may be repeated any number of times in order to produce a film stack that comprises any number of alternating layers formed with a high-pressure process and a low pressure process. For example, alternating layers of tungsten (formed with a low-pressure PVD process) and silicon oxide (formed with a CVD process) may be formed over a substrate without removing the substrate from the processing tool. While tungsten and silicon oxide are provided as exemplary material layers, it is to be appreciated that any pair of materials may be used, where the first material is formed with a high-pressure process and the second material is formed with a low-pressure process. Additionally, it is to be appreciated that embodiments are not limited to two materials. For example, different materials may be deposited by changing the processing gasses. For example, three or more different material layers may be formed on a substrate in a single processing tool.

Figure 6:
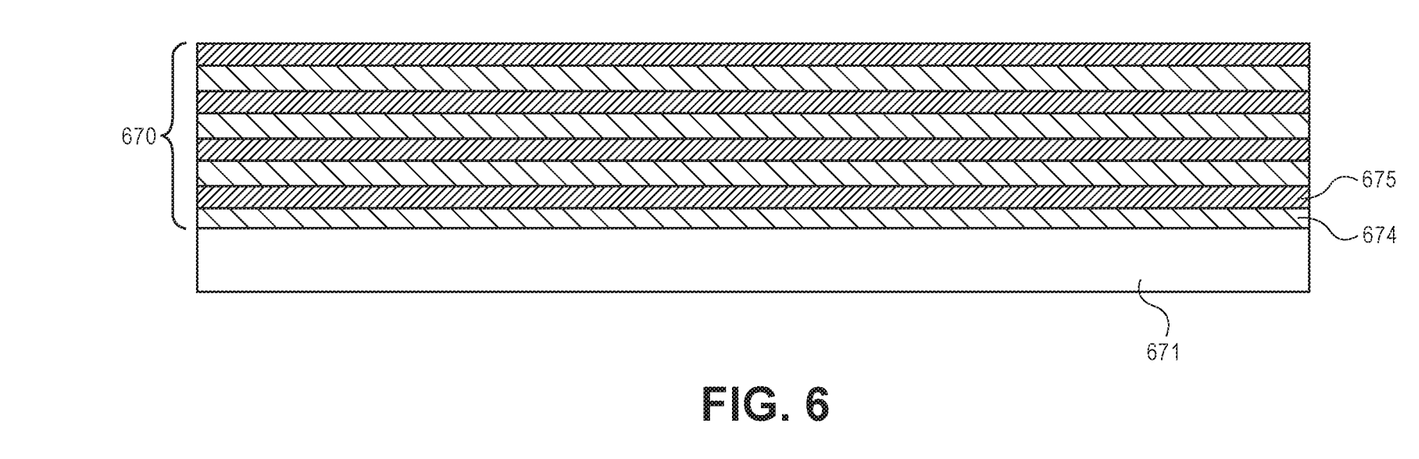
FIG. 6 is a cross-sectional illustration of a multi-layer stack that comprises alternating first layers and second layers that is fabricated using a processing tool for implementing high-pressure and low-pressure processes, in accordance with an embodiment.

Referring now to FIG. 6, a cross-sectional illustration of an exemplary stack 670 that is formed with a process (such as method 590) is shown, in accordance with an embodiment. As shown, the stack 670 may be formed over a substrate 671. In an embodiment, the substrate 671 may comprise a wafer (e.g., a silicon wafer), a glass substrate, or any other suitable substrate 671. In an embodiment, the stack 670 may comprise first layers 674 and second layers 675. The first layers 674 and the second layers 675 may be arranged in an alternating pattern. For example, the first layers 674 may be formed with a low pressure process and the second layers may be formed with a high pressure process, using a processing tool such as those described above.

In an embodiment, the stack 670 may be suitable for forming a memory device. For example, the stack 670 may be used to fabricate a 3D NAND device. In such an embodiment, the first layers 674 may comprise a conductive material and the second layers may comprise an insulating material. For example, the first layers 674 may comprise tungsten, molybdenum, or any other conductive material that can be deposited with a low pressure process, such as PVD. In an embodiment, the second layers 675 may comprise $SiO_2$ or any other suitable insulative material.

In an embodiment, the stack 670 may be suitable for use as an optical device. For example, a stack 670 of alternating first layers 674 and second layers 675 may be used to form a mirror (e.g., a Bragg mirror), an optical resonator, or the like. With respect to a Bragg mirror, the first layers 674 may comprise a material with a high index of refraction and the second layers 675 may comprise a material with a low index of refraction. For example, the first layers 674 may comprise a metal oxide, a metal nitride, or the like, and the second layers 675 may comprise $SiO_2$ or other low index of refraction material. In a particular embodiment, the first layers 674 may comprise $Ta_2O_5$ or $TiO_2$.

The use of a processing tool, such as those described herein, provides improved optical properties compared to exiting deposition techniques. Particularly, the use of a low pressure process to form $SiO_2$ (e.g., PVD) is slow and results in poor surface roughness. As such, if a stack comprising a metal oxide film and $SiO_2$ film is formed in a PVD chamber, the results are not optimal. In order to improve the surface roughness in a PVD chamber, a bias may be applied to the substrate. However, this adds a high compressive strain to the layer and deteriorates optical performance due to bowing of the mirror. In contrast, embodiments disclosed herein allow for the metal oxide to be deposited with a PVD process, and the $SiO_2$ can be deposited with a high pressure process (e.g., PECVD or the like) within a single chamber. Accordingly, low surface roughness provided by the high pressure process provides improved optical performance. Furthermore, the high pressure process may be implemented as a dual frequency process in order to tune the stress within the film. As such, adjustments may be made to further control the resulting optical properties.

Figure 7:
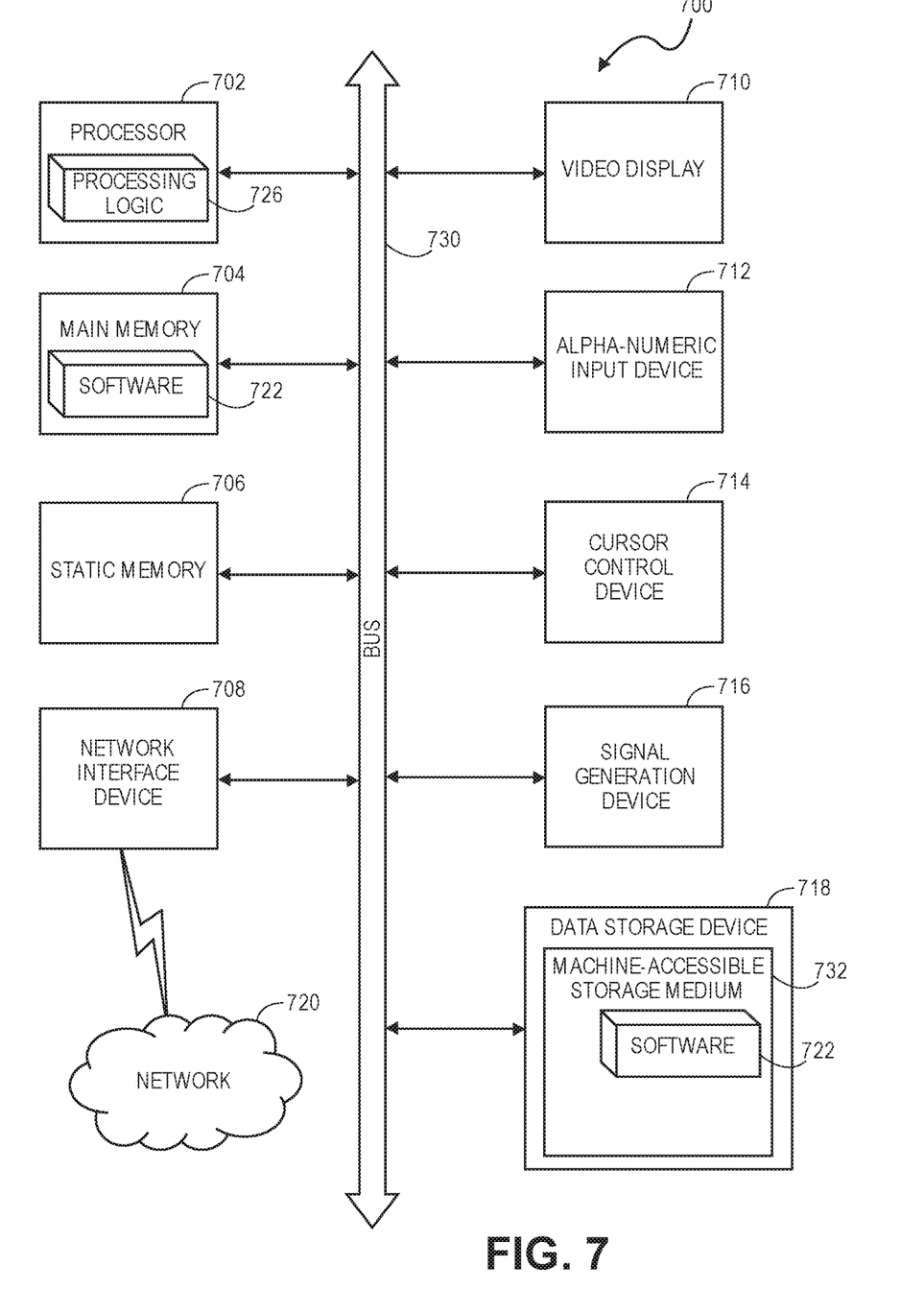
FIG. 7 illustrates a block diagram of an exemplary computer system that may be used in conjunction with a processing tool for implementing high-pressure and low-pressure processing operations, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool comprising:
a chamber body;
a pedestal in the chamber body, wherein the pedestal is displaceable between an upper processing location and a lower processing location, and wherein the pedestal has a first surface and a second surface opposite and below the first surface;
a first gas port for supplying gasses into the chamber body, wherein the first gas port passes through a top surface of the chamber body;
a first exhaust positioned above the first surface of the pedestal, wherein the first exhaust passes through a sidewall of the chamber body;
a second gas port for supplying gasses into the chamber body, wherein the second gas port passes through a bottom surface of the chamber body, the bottom surface opposite the top surface, wherein the second gas port vertically overlaps with the first gas port, and wherein the pedestal extends vertically over the second gas port; and
a second exhaust below the first exhaust, the second exhaust positioned below the second surface of the pedestal when the pedestal is in the lower processing location, wherein the processing tool is configured to process a substrate in the upper processing location with a first processing operation at a first pressure to form a first film on the substrate, and then to process the substrate in the lower processing location with a second processing operation at a second pressure to form a second film on the substrate, the second pressure lower than the first pressure.

2. The processing tool of claim 1, wherein an edge of the pedestal is separated from surfaces of the chamber body.

3. The processing tool of claim 1, further comprising a cross-contamination feature that interfaces with the pedestal.

4. The processing tool of claim 3, wherein the pedestal directly contacts the cross-contamination feature.

5. The processing tool of claim 3, wherein the pedestal is separated from the cross-contamination feature by an elastomer seal.

6. The processing tool of claim 1, further comprising:
an off-axis chamber portion, wherein the off-axis chamber portion comprises a sputtering target.

7. The processing tool of claim 1, wherein the first gas port supplies first processing gasses into the chamber body for the first processing operation.

8. The processing tool of claim 7, wherein the first pressure of the first processing operation is greater than 1 Torr.

9. The processing tool of claim 1, wherein the second gas port supplies second processing gasses into the chamber body for the second processing operation.

10. The processing tool of claim 9, wherein the second pressure of the second processing operation is less than 1 Torr.

11. The processing tool of claim 9, wherein the second gas port further supplies an inert gas into the chamber body during the first processing operation, wherein the inert gas comprises one or more of Ar, He, and $N_2$.

\* \* \* \* \*